US011210600B2

(12) United States Patent
von Salis et al.

(10) Patent No.: US 11,210,600 B2
(45) Date of Patent: Dec. 28, 2021

(54) MULTI-QUBIT ENTANGLING GATE USING A FREQUENCY-MODULATED TUNABLE COUPLER

(71) Applicant: International Business Machines Corporation, Armonk, NY (US)

(72) Inventors: Gian R. von Salis, Aeugst a. A. (CH); Nikolaj Moll, Thalwil (CH); Marc Ganzhorn, Muhen (CH); Daniel J. Egger, Thalwil (CH); Stefan Filipp, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 904 days.

(21) Appl. No.: 15/975,011

(22) Filed: May 9, 2018

(65) Prior Publication Data

US 2019/0347576 A1 Nov. 14, 2019

(51) Int. Cl.
*G06N 10/00* (2019.01)
*G06F 15/80* (2006.01)
*G06F 13/36* (2006.01)

(52) U.S. Cl.
CPC ............. *G06N 10/00* (2019.01); *G06F 13/36* (2013.01); *G06F 15/80* (2013.01)

(58) Field of Classification Search
None
See application file for complete search history.

(56) References Cited

U.S. PATENT DOCUMENTS

| 7,836,007 | B2 * | 11/2010 | Beausoleil | G06N 10/00 706/62 |
| 8,022,722 | B1 * | 9/2011 | Pesetski | B82Y 10/00 326/7 |
| 10,074,056 | B2 * | 9/2018 | Epstein | H03K 19/195 |
| 10,074,792 | B1 * | 9/2018 | Ferguson | G06N 10/00 |
| 10,354,198 | B1 * | 7/2019 | Filipp | H01L 27/18 |

(Continued)

OTHER PUBLICATIONS

Abdel-Aty,M., Perspectives for a mixed two-qubit system with binomial quantum states, 2004, Institute of Physics Publishing, Journal of Optics B:Quantum and Semiclassical optics, pp. 201-210. (Year: 2004).*

(Continued)

*Primary Examiner* — Eric Coleman
(74) *Attorney, Agent, or Firm* — Scully, Scott, Murphy & Presser, P C.; Daniel P. Morris

(57) ABSTRACT

A quantum processing comprises n fixed-frequency quantum circuits of distinct frequencies, where n≥3. The device further comprises a frequency-tunable coupler, designed in such a manner that its frequency can be concomitantly modulated at m frequencies, where m≥2, and wherein said m frequencies correspond, each, to a difference of energy between a respective pair of quantum states spanned by the quantum circuits. The quantum circuits are, each, coupled to the tunable coupler. The method may rely on modulating the frequency of the tunable coupler concomitantly at said m frequencies. This, for example, is done so as to drive m energy transitions between connected pairs of states spanned by the quantum circuits and achieve an entangled state of the quantum circuits as a superposition of l states spanned by the quantum circuits, l≥m.

18 Claims, 8 Drawing Sheets

(56) References Cited

U.S. PATENT DOCUMENTS

| | | | | |
|---|---|---|---|---|
| 10,552,755 | B2* | 2/2020 | Lanting | G06N 10/00 |
| 2015/0066834 | A1* | 3/2015 | Jeffries | H03M 7/3068 |
| | | | | 706/52 |
| 2015/0111754 | A1* | 4/2015 | Harris | G06N 10/00 |
| | | | | 505/170 |
| 2016/0292586 | A1* | 10/2016 | Rigetti | G06N 20/00 |
| 2017/0116542 | A1* | 4/2017 | Shim | G11C 11/44 |

OTHER PUBLICATIONS

Vasconcelos, H.M. etal., All-optical generation of states for Encoding a qubit in an oscillator, 2010, Optical society of America, Optics Letters, vol. 35, No. 19, pp. 3261-3263. (Year: 2010).*
Strauch, F.W. etal., Theory of Superconducting Phase Qubits, 2004, Univ. of MD College Park., Doctoral Dissertation, 371 pages. (Year: 2004).*
Yang, C.-P., et al., "Entangling Superconducting Qubits in a Multi-Cavity System", New Journal of Physics, Jan. 2016, 14 pages, vol. 18.
Yang, C.-P., et al., "One-Step Transfer or Exchange of Arbitrary Multipartite Quantum States with a Single-Qubit Coupler", Physical Review B, Aug. 1, 2015, pp. 054509-1-054509-11, vol. 92, Issue 5.
Neeley, M., et al., "Generation of Three-Qubit Entangled States Using Superconducting Phase Qubits", Nature 467, arXiv:1004.4246v2, Apr. 29, 2010, 9 pages.
Molmer, K., et al., "Multiparticle Entanglement of Hot Trapped Ions", Physical Review Letters, Mar. 1, 1999, pp. 1835-1838, vol. 82, No. 9.
Noguchi, A., et al., "Generation of Dicke States with Phonon-Mediated Multilevel Stimulated Raman Adiabatic Passage", Physical Review Letters, Week Ending Dec. 28, 2012, pp. 260502-1-260502-5, vol. 109.
Corcoles, A.D., et al., "Demonstration of a quantum error detection code using a square lattice of four superconducting qubits", Accepted Mar. 18, 2015, Published Apr. 29, 2015, Nature Communications, 10 pages, vol. 6:6979.
Barends, R., et al., "Digitized adiabatic quantum computing with a superconducting circuit", Nature, Jun. 9, 2016, pp. 222-226, vol. 534.
Egger, D.J., et al., "Adaptive Hybrid Optimal Quantum Control for Imprecisely Characterized Systems", Physical Review Letters, Week ending Jun. 20, 2014, pp. 240503-1-240503-5, vol. 112.
Kelly, J., et al., "Optimal Quantum Control Using Randomized Benchmarking", Physical Review Letters, Week ending Jun. 20, 2014, pp. 240504-1-240504-5, vol. 112.
Abdumalikov, A.A., et al., "Experimental realization of non-Abelian non-adiabatic geometric gates", Nature, Apr. 25, 2013, pp. 482-485, vol. 496.
Amniat-Talab, M., et al., "Superposition of states by adiabatic passage in N-pod systems", Physical Review, Published Jan. 21, 2011, pp. 013817-1-013817-7, vol. A 83.
Rigetti, C., et al., "Fully microwave-tunable universal gates in superconducting qubits with linear couplings and fixed transition frequencies", Physical Review, Revised Mar. 10, 2010, Published Apr. 5, 2010, pp. 134507-1-134507-7, vol. B 81.
McKay, D.C., et al., "Universal Gate for Fixed-Frequency Qubits via a Tunable Bus", Physical Review Applied, Revised Aug. 18, 2016, Published Dec. 12, 2016, pp. 064007-1-064007-10, vol. 6.
Farhi, E., "Quantum Supremacy through the Quantum Approximate Optimization Algorithm", arXiv:1602.07674, Submitted on Feb. 24, 2016, Feb. 25, 2016, 22 pages.

* cited by examiner

MULTI-QUBIT ENTANGLING GATE USING A FREQUENCY-MODULATED TUNABLE COUPLER

BACKGROUND

The disclosure relates in general to the field of quantum processing devices and operation thereof. In particular, it is directed to methods of operating quantum processing devices with fixed frequency quantum circuits (e.g., superconducting qubits), coupled to a frequency-tunable coupler, as well as related devices.

Recent advances in quantum computing are making such a technology ever more relevant to industrial applications. Quantum computing makes direct use of quantum-mechanical phenomena, such as superposition and entanglement to perform operations on entangled quantum bits, i.e., states stored in quantum bits. Superconducting circuits are relatively easy to manufacture with current technologies and are thus promising candidates to further scale quantum information technologies. Today, it can be envisioned that in the near term a small quantum computer, based on a couple of hundreds of superconducting qubits with limited to no error correction, will be able to simulate quantum systems intractable to conventional computers.

Possible applications on quantum machines include the solving of hard optimization problems that are beyond the reach of classical algorithms. For example, quantum optimizations based on the variational principle are particularly appealing. In this approach, an objective function is minimized by varying a trial state which depends on a few parameters. Applications to quantum chemistry, metrology tasks or efficient error-syndrome measurements in error correction codes can notably be contemplated. Such examples of applications require the creation of initial states, as in many quantum algorithms. E.g., the initial states need be entangled over many qubits, which so far is typically achieved by applying a sequence of single and two-qubit gate operations to a ground state.

However, despite improvements in engineering quantum systems, superconducting qubits can reliably store quantum information only for a finite time, which is known as the coherence time. When the duration of the state preparation and (algorithmic) manipulation is comparable to or larger than the coherence time, the system can no longer be operated. Thus, the total time needed to run the algorithm should be shorter than the coherence time for such qubit systems. Now, the current gate operations consume a substantial amount of the coherence time of the qubits. This preparation limits the number of qubits that can be used in practice because the duration of the state preparation increases with the number of qubits, since only two qubits can typically be entangled at the same time, which conflicts with the finite coherence time available. It is therefore desirable to create states (be they initial states or subsequent states) and manipulate such states in shorter times, using a hardware-efficient multi-qubit entangling gate.

Quantum computing ideally needs a rapid and high-fidelity generation of highly entangled multi-qubit states. Shorter state preparation times would allow a quantum computer to perform with less error and be scaled to a larger number of qubits. More generally, one understands that the preparation time of the initial state of any type of computational quantum circuits should be reduced as possible.

In the field of superconducting qubits, the multi-qubit, single-step state preparation problem was so far not an issue. Indeed, the size of the systems was until recently limited to a few qubits, for which two-qubit entangling gates are affordable. For example, two-qubit gates are known, which are implemented with transmon qubits, where the qubits are coupled via a frequency tunable coupler element. In contrast to other approaches, this implementation takes advantage of the high coherence of fixed frequency qubits to generate entangled two qubit states with fidelities of more than 97%.

In particular, an architecture has been proposed, wherein two qubits are connected to a single tunable coupler (TC), by David C. McKay and co-workers (Phys. Rev. Appl. 6, 064007 (2016)). This architecture allows transitions between two states of the two qubits to be parametrically driven, by modulating the TC energy at a frequency that corresponds to the difference of the energy between the two states.

SUMMARY

According to a first aspect, the present invention is embodied as a method of operating a quantum processing device. The device comprises n fixed-frequency quantum circuits (e.g., superconducting qubits) of distinct frequencies, where n≥3. The device further comprises a frequency-tunable coupler, designed in such a manner that its frequency can be concomitantly modulated at m frequencies, where m≥2, and wherein said m frequencies correspond, each, to a difference of energy between a respective pair of quantum states spanned by the quantum circuits. The quantum circuits are, each, coupled to the tunable coupler. The method relies on modulating the frequency of the tunable coupler concomitantly at said m frequencies. This is done so as to drive m energy transitions between connected pairs of states spanned by the quantum circuits, i.e., distinct pairs that nevertheless connect two-by-two via a same state of the system. This way, an entangled state of the quantum circuits can efficiently be achieved as a superposition of l states spanned by the quantum circuits, where l≥m.

According to another aspect, the present invention is embodied as a quantum processing device. Consistently with the above method, this device comprises n fixed-frequency quantum circuits of distinct frequencies, n≥3, as well as a frequency-tunable coupler, to which the n quantum circuits are coupled. The coupler is again designed so that its frequency can be concomitantly modulated at m frequencies, m≥2, wherein said frequencies correspond, each, to a difference of energy as defined above. The device further includes a controller, which is configured in the device so as to modulate the frequency of the tunable coupler concomitantly at said m frequencies. This way, m energy transitions between connected pairs of states spanned by the quantum circuits can be driven, in operation of the device, so as to achieve an entangled state of the quantum circuits as a superposition of l states spanned by the quantum circuits, where l≥m.

According to yet another aspect, the present invention is embodied as a quantum processing chip, where the chip comprises a plurality of cells, each including n fixed-frequency quantum circuits and a frequency-tunable coupler as in the above device. The chip further includes a controller system, which is configured in the chip to selectably modulate a frequency of signals applied to the tunable coupler of the cells. That is, the controller system is configured to concomitantly modulate the frequency of signals applied to the coupler of each cell, at m frequencies, so as to drive m energy transitions between connected pairs of states spanned by the quantum circuits in selected ones of the cells. This way, for each of the selected cells, an entangled state of the quantum circuits of this cell can be achieved as a superposition of 1 states spanned by the quantum circuits, l≥m, in operation of the chip.

Quantum processing devices, chips, and methods embodying the present invention will now be described, by way of non-limiting examples, and in reference to the accompanying drawings.

BRIEF DESCRIPTION OF SEVERAL VIEWS OF THE DRAWINGS

The accompanying figures, where like reference numerals refer to identical or functionally similar elements throughout the separate views, and which together with the detailed description below are incorporated in and form part of the present specification, serve to further illustrate various embodiments and to explain various principles and advantages all in accordance with the present disclosure, in which.

The accompanying drawings show simplified representations of devices or parts thereof, as involved in embodiments. Similar or functionally similar elements in the figures have been allocated the same numeral references, unless otherwise indicated.

DETAILED DESCRIPTION OF EMBODIMENTS OF THE INVENTION

Figure 1:
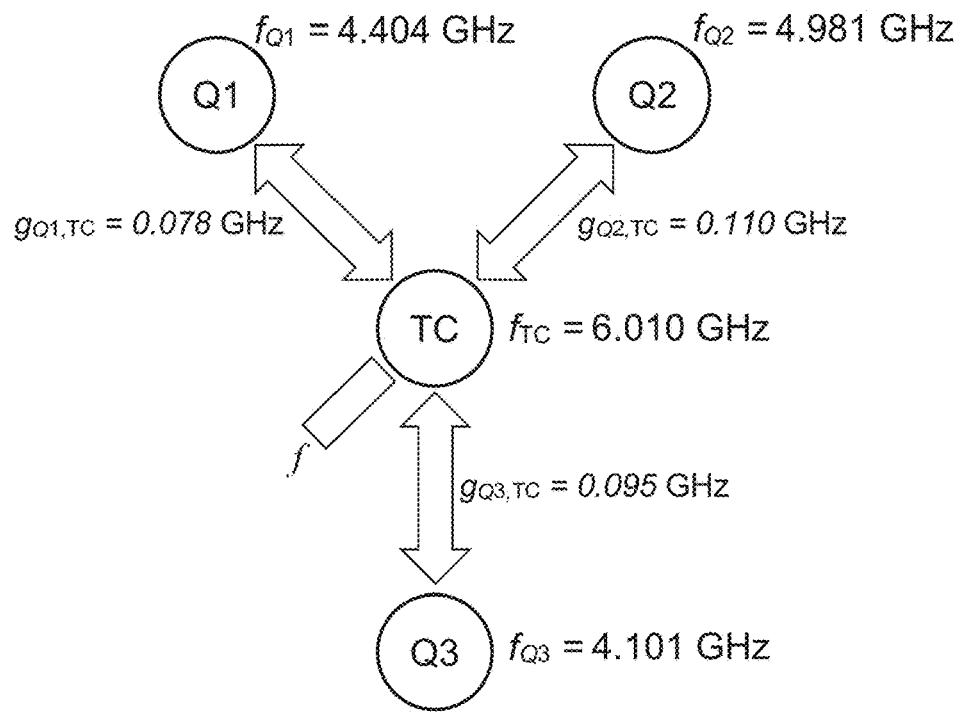
FIG. 1 schematically illustrates three fixed-frequency qubits, each coupled to a frequency-tunable coupler, as well as associated frequencies and coupling strengths, as involved in quantum processing devices according to embodiments.

The architecture previously proposed by McKay and co-workers, wherein two qubits are connected to a single tunable coupler (TC), allows transitions between two states of the two qubits to be parametrically driven, by modulating the TC energy at a frequency that corresponds to the difference of the energy between the two states. Using a system as proposed by McKay and co-workers, a transition between the states |01™ and |10™ can be accomplished by making the energy of the TC oscillate at a frequency $f_\Delta$ that matches the energy difference between the two states. Similarly, transitions between the states |11™ and |00™ can be driven by using a frequency $f_\Sigma$ corresponding to the energy difference between |11™ and |00™. Such oscillations of the TC energy is achieved by modulating a flux line positioned in close proximity with the TC. The solution proposed by McKay et al. accordingly allows two transitions between disconnected pairs of states (i.e., on the one hand |01™ and |10™ and, on the other hand, |11™ and |00™) to be achieved by using distinct frequencies to modulate the frequency of the tunable coupler.

As present Inventors have discovered, novel architectures and methods of operation can be achieved, which make it possible to couple more than two quantum circuits (QCs), via a tunable coupler (TC) that can concomitantly be modulated at two or more frequencies. Interestingly, this approach allows two or more transitions to be achieved between connected pairs of states of the QC system and bring the system into a superposition of three or more of such states. Using three or more QCs allows, together with transitions between connected pairs of states of the system, more flexibility and large combinations of superpositions of states to be achieved in short times.

Various methods and devices embodying the invention are described in the following description, which is structured as follows. First, general embodiments and high-level variants are described (sect. 1). The next section addresses more specific embodiments and technical implementation details (sect. 2).

1. General Embodiments and High-Level Variants

Referring to FIGS. 1, 2, 7 and 11, an aspect of the invention is first described, which concerns a method of operating a quantum processing device 1, 2, 3. Examples of such devices, which concern other aspects of the invention, are described later in detail, in reference to FIGS. 7-10. A minima, this device 1, 2, 3 comprises a frequency-tunable coupler 20, as well as n fixed-frequency quantum circuits 11-14, 1j, wherein each of the quantum circuits (or QCs for short) have distinct frequencies.

The present "quantum circuits" 11-14, 1j are meant to be used as computational qubits. On the contrary, the tunable coupler 20 is here not meant to be used as a computational QC in the processing device, even though the coupler 20 can practically be embodied as a qubit, as discussed later. Rather, the role of the coupler 20 is merely to couple the computational QCs, to achieve the desired transitions.

At least three QCs are involved ($n \geq 3$), which are, each, coupled to the tunable coupler 20. The latter is designed so that its frequency can be concomitantly modulated at several frequencies. At least one tunable coupler 20 is involved. Yet, the entanglement circuit may possibly involve a larger array of quantum circuits, which may include more couplers 20 and/or more QCs, as discussed later, in reference to FIGS. 7-10.

Basically, the present method revolves around concomitantly (e.g., simultaneously) modulating (see step S20 in the flowchart of FIG. 11) the frequency of the tunable coupler 20 at m frequencies, where $m \geq 2$. Each of the m frequencies corresponds to a difference of energy between a respective pair of quantum states spanned by the quantum circuits. The modulation is performed so as to drive (step S30) m energy transitions between distinct but connected pairs of states of the system.

Figure 4:
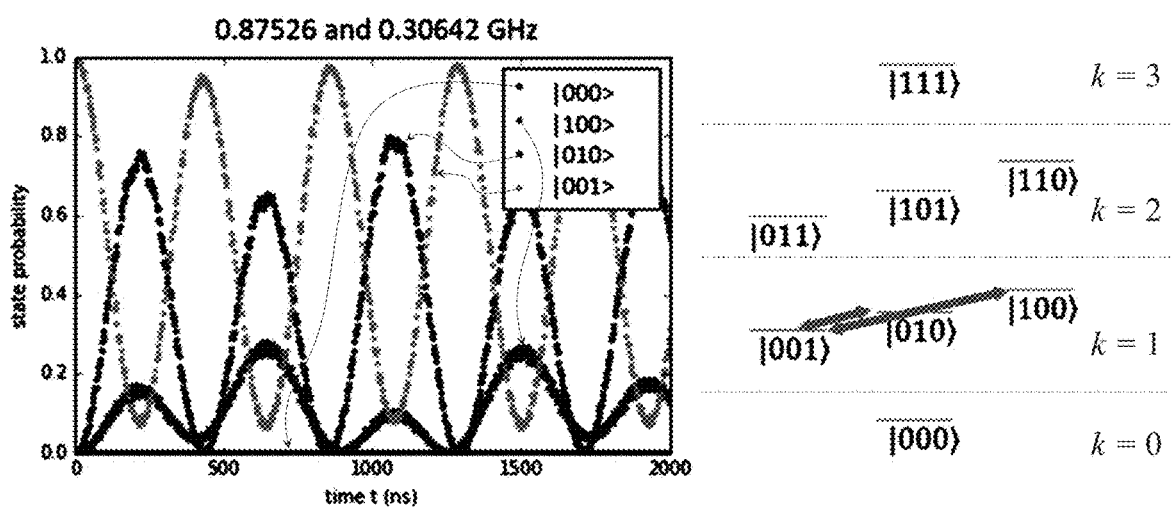
FIG. 4 shows a plot similar to that of FIG. 3, except that the frequency of the tunable coupler is here assumed to be concomitantly modulated at two frequencies driving two transitions from/to the state |001™ of the multi-qubit coupling system, as depicted in the right-hand side graphic and as involved in embodiments. Here, the depicted transitions (also referred to as difference transitions) involve, each, two anti-parallel transitions of the individual qubit states.
Figure 5:
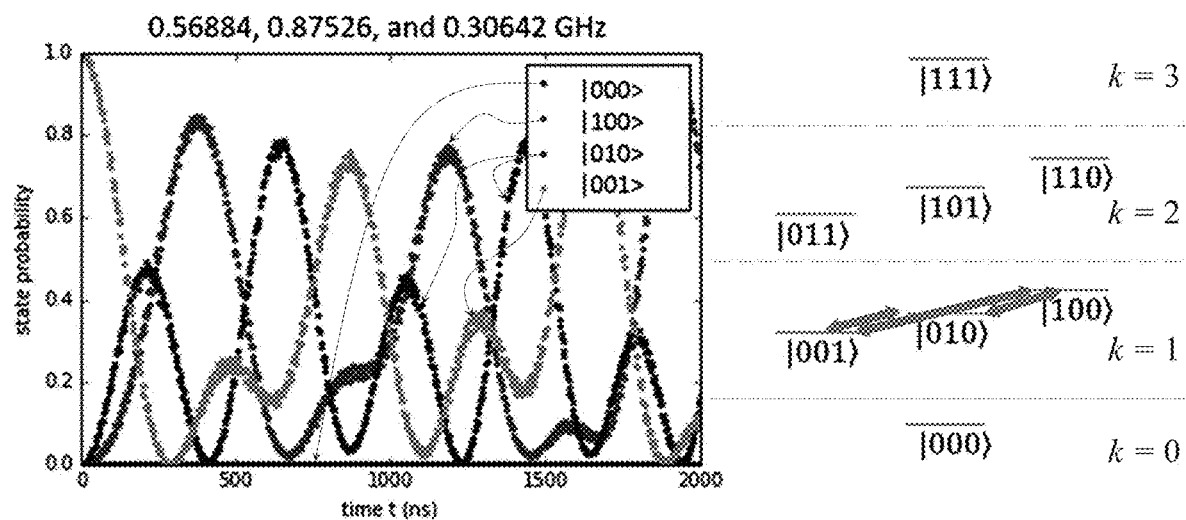
FIG. 5 is similar to FIG. 4, except that three transitions of the multi-qubit system are now involved, as depicted in the right-hand side graphic and as involved in embodiments. The three transitions again involve, each, two anti-parallel transitions of the individual qubit states.
Figure 6:
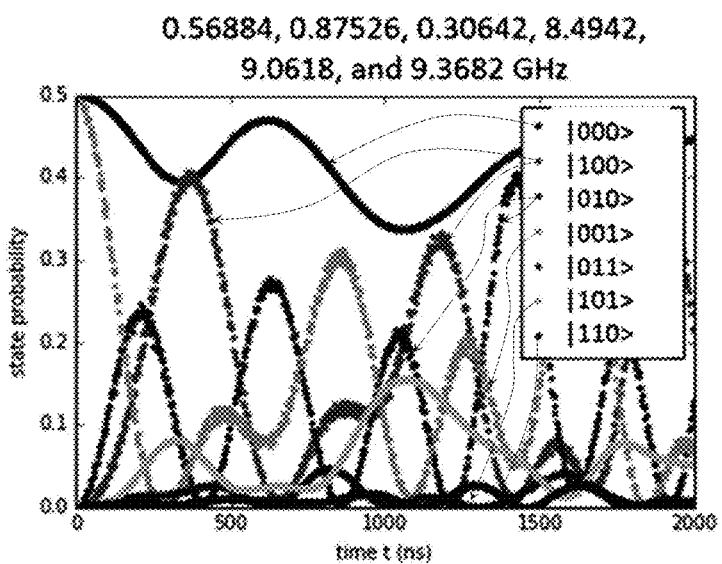
FIG. 6 shows another plot representing the evolution of the qubit populations of a multi-qubit system, where the frequency of the tunable coupler is now assumed to be concomitantly modulated at six frequencies, thereby driving six transitions (not shown), which involve both parallel and anti-parallel transitions of the individual qubit states, as in embodiments.
Figure 7:
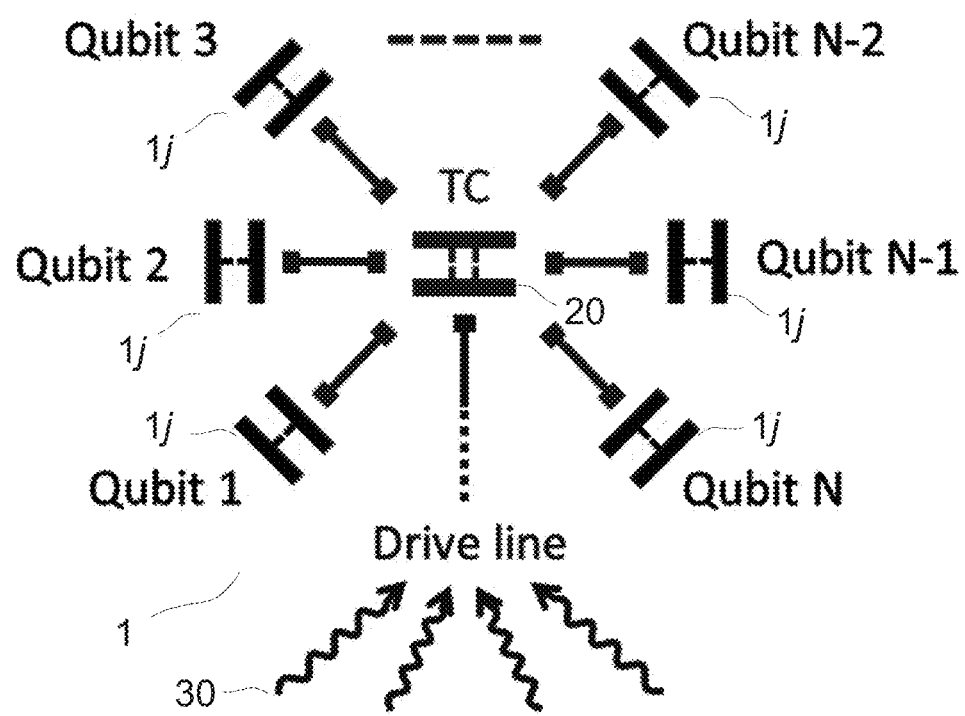
FIG. 7 schematically illustrates the modulation of the tunable coupler frequency, to which N transmon qubits are coupled, wherein harmonic microwave tones are simultaneously applied to the tunable coupler element via a single drive line, as in embodiments.

System states refer to states spanned altogether by the QCs of the system, e.g., like the state $|001\rangle$ in a system comprising three QCs, whereas states $|0\rangle$ and $|1\rangle$ refer to individual states of the QCs, as discussed later in detail. The pairs of states between which the transitions selectably occur are connected two-by-two, i.e., via a common state, as illustrated in the diagrams of FIGS. 2-5. That is, if one transition occurs between states $|A\rangle$ and $|B\rangle$, then at least one other transition will occur between states $|C\rangle$ and $|D\rangle$, where either $|C\rangle$ or $|D\rangle$ is equal to one of $|A\rangle$ and $|B\rangle$. For example, a first transition may occur between a first pair of states $|001\rangle$ and $|010\rangle$ and a second transition may occur between a second pair of states $|001\rangle$ and $|100\rangle$, such that the two pairs of states between which transitions occur are connected via the same state $|001\rangle$, as illustrated in FIG. 4. Optionally, a further transition may be driven between states $|E\rangle$ and $|F\rangle$, where either $|E\rangle$ or $|F\rangle$ is equal to one of $|A\rangle$, $|B\rangle$, $|C\rangle$ and $|D\rangle$, and so on. For example, a third transition may occur between states $|010\rangle$ and $|100\rangle$, such that the third pair of states between which the third transition occurs in this example is connected to the second pair of states ($|001\rangle$ and $|100\rangle$) via the common state $|100\rangle$, as illustrated in FIG. 5. In other words, the pairs of states between which transitions occur are connected two-by-two, albeit distinct.

As exemplified later, the transitions involved are bidirectional, such that a transition between states $|A\rangle$ and $|B\rangle$ concurrently involves both an excitation of population from state $|A\rangle$ to state $|B\rangle$ and a de-excitation of population from state $|B\rangle$ to state $|A\rangle$. Triggering transitions between connected pairs of multi-QC states eventually allows an entanglement between all the computational QCs involved to be achieved, as opposed to transitions between unconnected pairs of states.

Direct energy transitions between multi-QC states are contemplated. I.e., such transitions result in direct population transfers between two multi-QC states, even if they are mediated through the tunable coupler. Such transitions will normally occur concomitantly, as per the concomitant modulation of the frequency of the tunable coupler (hereafter TC). Yet, there is no reason for such transitions to be perfectly synchronous, owing to the physics involved.

The present approach leverages the high-coherence of the fixed frequency circuits and short operation times allowed by the concomitant transitions, to achieve high gate rates. This way, a number of fixed frequency QCs can be entangled within a single, short operation, such that shorter state preparation can be obtained. Namely, an entangled state of the system formed by the QCs is achieved S40 as a superposition of l states spanned by the QCs ($l \geq m$). Examples of such entangled states are discussed later. This, in turn, makes it possible for a quantum processing device to be to be scaled to a larger number of QCs. In addition, the present approach may be leveraged for a quantum computer to perform with less error or a quantum sensor to provide a better sensitivity.

As noted above, the QCs have distinct frequencies, which makes it possible to selectively address the desired state transitions of the system, by appropriately choosing the driving frequencies. Such frequencies correspond, each, to a difference of energy between a respective pair of states of the system. I.e., such frequencies may exactly match respective energy differences or, in variants, be close enough to such differences, for the desired transitions to take place. That is, the driving of a transition can be resonant (i.e., the energy difference exactly matches the drive frequency) or slightly off-resonant (i.e., the energy difference is slightly off the drive frequency). However, since an off-resonant transition affects the fidelity of the entangled state, the drive frequency should preferably match the energy difference as exactly as possible.

As evoked above, the quantum states of the multi-QC system must be distinguished from individual quantum states of the QCs. Each of the QCs can be associated to at least two distinct, individual quantum states $|a\rangle$. E.g., each QC may be associated to an individual state that correspond to a ground state $|0\rangle$ or a first excited state $|1\rangle$ of this QC. On the other hand, the states spanned by the multi-QC system can be regarded as tensor products $|abc \ldots\rangle$ of individual QC states. However, the system states referred to above and in the following description do not involve individual quantum states of the tunable coupler. I.e., the present methods are agnostic to the actual quantum state of the coupler 20, which is not meant to be used as a computational qubit. Instead, the tunable coupler is used to mediate transitions between multi-QC states of the system.

Assuming that each QC has (at least) two distinct states, then $2^n$ states (at least) of the multi-QC system can potentially be populated. Now, in embodiments described herein, the QCs are mostly assumed to behave as two-level subsystems, such that each QC can be in one of two states, which typically are the ground state $|0\rangle$ and the first excited state $|1\rangle$ of this subsystem. One may therefore consider that only $2^n$ states of the multi-QC system can potentially be populated. For instance, each of FIGS. 2-6 assume a system that comprises n=3 QCs only, where each QC is considered to behave as a two-level subsystem. In the following, such a system is referred to as a "three-QC system", for short.

In practice, one may typically seek to obtain a superposition of $l=m=n$ states of the multi-QC system. I.e., the number l of states eventually involved in the superposition would be equal to both the number n of QCs and the number m of transitions in that case. However, there are many exceptions. For example, m transitions from a same initial state (e.g., the ground state) of the QCs may lead to a superposition of l=m+1 states, this including the initial state in addition to the m target states as selectively caused by the m driving frequencies. In addition, larger superpositions can be achieved when starting from an initial state that is already a superposition (e.g., |000™+|001™, as discussed later in reference to FIG. 6). Thus, in general, the number of system states involved in the superposition achieved may be equal to or larger than the number m of frequencies used for modulation.

As it may be realized, the present methods make it possible to easily and quickly achieve complex multi-partite, initial entangled states of n QCs, thanks to the concomitant modulation at m frequencies. In practice, an initial entangled state may typically be achieved within less than 300 ns, i.e., in a time comparable to the time needed for a single, multi-QC state transition. The present approach can be used for various applications, such as evoked in the background section. In particular, it can be used in quantum sensing and quantum computing devices.

As illustrated in the diagrams of FIGS. 2-6, a system of n QCs of distinct (but typically close) frequencies gives rise to n+1 distinct excitation manifolds of levels of states. In the following, such a manifold is labeled by an index k and termed "k-excitation manifold" (or simply "manifold"), where states in a same k-excitation manifold may have somewhat close energy values. Still, the actual distribution of the energy levels of the multi-QC states will depend on a number of factors, including the frequencies of the QCs. At a given manifold k (n≥k≥0), the number of states of the system of n QCs is equal to C(n, k), where C(n, k) denotes the binomial coefficient $\binom{n}{k}$. For example, in FIGS. 2-6, which assume 3 QCs only, there are successively C(3, 0)=1, C(3, 1)=3, C(3, 2)=3, and C(3, 3)=1 states on each of the successive manifolds k=0, 1, 2, 3.

Thus, at a given manifold k, C(n, k) states are potentially available for transitions with a state of another manifold. For example, at the k=2 manifold, there are C(3, 2)=3 states available for transitions with the ground state |000™, as exemplified in FIG. 2 or 3. On the other hand, there are potentially C(C(n, k), 2)=C(n, k) (C(n, k)−1)/2 pairs of states available for transitions within a same manifold k, as illustrated in FIGS. 4 and 5 for k=1. Thus, at most C(C(n, k), 2) transitions may be carried out within a same manifold k, e.g., C(C(3, 1), 2)=3 in FIG. 5, whereas at most C(n, k) transitions may be carried out towards or from a same manifold k. As we shall see, the selected transitions may precisely be restricted to transitions occurring within or to/from a single k-excitation manifold, where n>k>0.

For instance, in embodiments that are later referred to as "sum transitions" and "difference transitions", the frequency of the TC 20 is concomitantly modulated S20 at a restricted number m of frequencies. I.e., m is respectively restricted to the range C(n, k)≥m≥2 or C(C(n, k), 2) m≥2, respectively, where n corresponds to the number of QCs and n−1≥k≥1. Yet, complex entanglement operations can be contemplated, which concurrently involve sum transitions and difference transitions and require a larger number m of transitions. All this is explained in detail in the following.

For difference transitions, the selected transitions restrict to transitions permitted within a same k-excitation manifold (for n−1≥k≥1). The number of permitted transitions is limited by C(C(n, k), 2), which is the number of pairs of states available within that given manifold. Alternatively, only C(n, k) states are potentially available for sum transitions (i.e., transitions that may occur to/from a same manifold k, for n−1≥k≥1). It is noted that each of the conditions C(C(n, k), 2)≥C(n, k) and C(n, k)≥2 is systematically verified when n≥3 and n−1≥k≥1.

In detail, one may for instance select m=C(n, k) frequencies to create C(n, k) transitions, when starting from a state distinct from the C(n, k) target states of the target manifold k. This is exemplified in FIGS. 2 and 3, which assume a three-QC system, whereby each of the three QCs is coupled to a same TC that is modulated so as to generate C(3, 2)=3 transitions from the ground state |000™ to states |011™, |101™ and |110™. I.e., the target manifold k=2 in the example of FIGS. 2, 3, it being noted that the case k=1 may similarly give rise to C(3, 1)=3 transitions (i.e., toward |001™, |010™ and |100™). However, because the transitions are mediated through the tunable coupler, additional selection rules will likely intervene, leading to additional constraints, e.g., Δk=2, which means that for each transition in embodiments corresponding to FIG. 2 or 3, two QCs simultaneously change states. Thus, sum transitions may occur between the ground state |000™ and states of the second manifold (k=2). Alternatively, states from the first manifold (k=1) may possibly be subject to transitions from/to the state |111™ (k=3), by suitably choosing the TC modulation signals.

Figure 2:
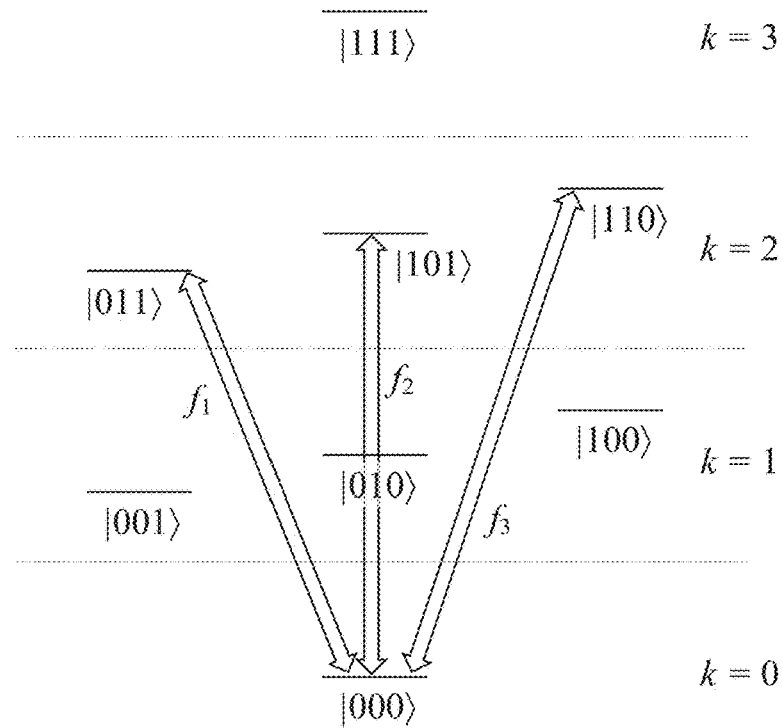
FIG. 2 is a graphic that schematically depicts quantum states associated to the multi-qubit system of FIG. 1, as well as three energy transitions driven between states spanned by the qubits, so as to achieve an entangled state as a superposition of such states, as in embodiments of the present method.
Figure 3:
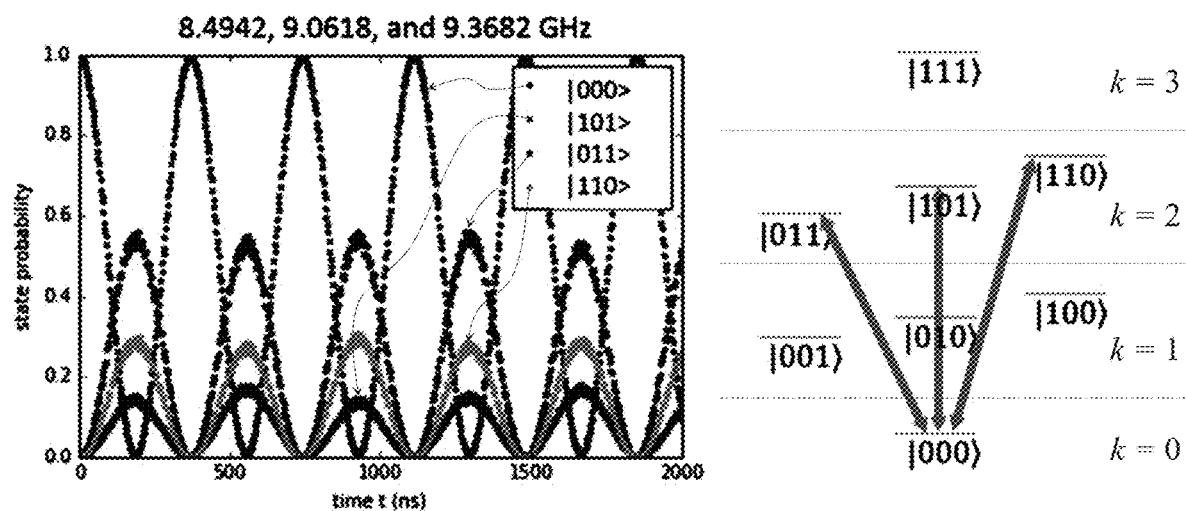
FIG. 3 shows a plot representing the evolution of the qubit populations of a multi-qubit coupling system as in FIG. 1, which is initially in its ground state |000™, when modulating the frequency of the tunable coupler concomitantly at three selected frequencies, so as to drive three energy transitions as depicted in the right-hand side graphic (corresponding to FIG. 2), as in embodiments. Here, the depicted transitions (also referred to as sum transitions) involve, each, two parallel transitions of the individual qubit states.

The example of FIG. 2 or 3 involves parallel transitions between individual QC states, for each multi-QC state transition from/to the ground state |000™. On the contrary, in the example of FIG. 4, two multi-QC state transitions occur within the same manifold k=1. Similarly, three transitions are depicted in FIG. 5, all involving pair of states within the same manifold k=1. One understands that at most C(C(n, k), 2) transitions are permitted in the examples of FIGS. 4 and 5, such that m≤C(C(n, k), 2) frequencies are used to select the desired transitions.

In each of the examples of FIGS. 2-5, the m frequencies $f_i$ used to modulate the TC frequency correspond, each, to a difference of energy levels between a pair of states spanned by the multi-QC system. Again, the states of each pair are assumed to be representable as tensor products of individual states |a™ of the QCs. For sum transitions (as in FIG. 2 or 3), the tensor products involved in each transition differ in exactly Δk of the individual states |a™ composing the tensor products (where Δk corresponds to the difference of the manifold numbers k involved in the transitions), whereas the individual states of the remaining QCs remains unchanged. For difference transitions (as illustrated in FIGS. 4 and 5), the tensor products involved in each transition differ in exactly 2 of the individual states |a™ composing the tensor products.

In more detail, in FIG. 3, where parallel transitions of individual states occur, the depicted transitions involve tensor products that differ in exactly Δk=2−0=2 individual states |a™ of the QCs. That is, in FIG. 3, starting from the ground state |000™, m=C(3, 2)=3 frequencies are used to populate all the permuted states {1,1,0}™ of manifold k=2. Considering, for example, a transition from |000™ to |011™, the state |0™ of the first QC remains unchanged, whereas individual states of the other QCs both change from |0™ to |1™, i.e., in a parallel fashion. However, since the transition between states |000™ and |011™ is bidirectional, a transition from |011™ to |000™ concurrently occurs, whereby individual states of two of the QCs both change from |1™ to |0™, again in a parallel fashion. Thus, a bidirectional transition between states |000™ and |011™ concurrently involve both the excitation of two QCs and a de-excitation of the same two QCs, wherein the two individual excitations from |0™ to |1™ are parallel and the two concurrent de-excitations from |1™ to |0™ are parallel too.

In other words, the corresponding, individual transitions can be regarded as parallel transitions.

On the contrary, in FIG. 4, where transitions are now restricted to occur within a same manifold (here k=1), the two transitions depicted involve anti-parallel transitions between individual QC states. Namely, two of the three QCs flip states in an anti-parallel fashion. For example, in the transition from |001™ to |010™, the second QC is excited from |0™ to |1™ whereas the third QC is de-excited from |1™ to |0™. Meanwhile, the transition from |010™ to |001™ results in opposite, individual transitions. Such transitions can be regarded as transitions from the so-called "exchange-type" (or "swap-type").

Note that in FIG. 3, C(3, 2)=3 transitions are used to populate the states |011™, |101™ and |110™, starting from |000™, which may eventually result in a superposition of four states, i.e., |000™, |011™, |101™ and |110™. More generally, one understands that a superposition of l=m+1 states may similarly be obtained when using C(n, k) transitions to populate states of a given manifold k from a state that does not belong to that manifold. Yet, if the frequency of the TC 20 is modulated S20 during a suitably chosen period of time, the population in the |000™ state may deplete (notwithstanding the bidirectional nature of the transitions involved), such that the entangled state eventually achieved S40 may restrict to a superposition of the l=m excited states of the multi-QC system (e.g., |001™, |010™ and |100™ for k=1 or |011™, |101™ and |110™ for k=2).

In the example of FIG. 3, each of the two individual parallel transitions involves an excitation from the ground state |0™ to the first excited state |1™ of a respective QC and, conversely, a de-excitation from the first excited state |1™ to the ground state |0™ of that same QC. More generally though, parallel transitions to/from a manifold k>1 may involve double, triple, quadruple, etc., (de-)excitations to/from states |abc . . . ™, where the states |abc . . . ™ are, each, representable as a tensor product involving excited (individual) states |1™ of exactly Δk QCs, whereas each of the remaining QCs can be described as remaining in its ground state |0™.

For difference transitions (i.e., intra-manifold transitions restricted within a same manifold k, as in FIG. 4), the frequency of the TC 20 can be modulated S20 at m C(C(n, k), 2) frequencies, starting from a given state (e.g., |001™, as in FIG. 4), so as to populate other states of that same manifold. Starting from a given state (e.g., |001™), one may concurrently enable transitions between, on the one hand, connected pairs involving the initial state |001™ and, on the other hand, between states distinct from the initial state, as in FIG. 5. In both cases, the transitions driven S30 involve anti-parallel transitions between individual states |a™ of the QCs.

In the examples of FIGS. 4 and 5, exactly two anti-parallel transitions occur for individual states |a™ of the QCs, for each of the driven S30 energy transitions of the multi-QC system. I.e., a first transition occurs between states |0™ and |1™ of a given QC, whereas a second transition occurs between states |1™ and |0™ of a second QC. More generally, the number of anti-parallel transitions may be a multiple of two for system state transitions occurring within a same manifold k. Thus, each of the intra-manifold transitions may involve anti-parallel transitions between one or more pairs of individual states |a™ of the quantum circuits.

Now, mechanisms can be devised, which intermingle parallel and anti-parallel transition of individual QC states. That is, the frequency of the TC may be modulated in such a manner that some of the driven S30 energy transitions involve parallel transitions, whereas other energy transitions involve anti-parallel transitions from individual states of the QC. This point is further discussed in sect. 2.3.

In practice, the m energy transitions can be driven by applying S10 harmonic microwave signals to the TC 20, where the signals are modulated S20 so as to modulate the frequency of the TC 20 at said m frequencies. In practice, this can be achieved by combining signals so as to form pulses that are applied for a certain duration. In fact, one may set S10 the amplitudes, phases and duration of the signals applied to the TC 20, so as to control the complex weights $a_i$ (i.e., the probability amplitudes in Eq. 1, see sect. 2) of the l states in the entangled state to be eventually achieved S40. Each complex weight encompasses both an amplitude and a phase of a coefficient in the linear combination of states sought. That is, one can change the duration of the TC modulation signals, in addition to their amplitudes and phases. A suitably chosen duration of the TC modulation signals applied allows a specific entangled state to be achieved.

In practice, in order to achieve a specific entangled state, one may perform a measurement such as depicted in the LHS of FIG. 3. Then, the amplitudes, phases and durations of the TC modulation signals can be set based on the specific state to be achieved and outcomes of such a measurement, which amounts to take into account the direct coupling strengths $q_{QCi,TC}$ (see FIG. 1) between the QCs and the TC.

Another aspect of the invention is now described, which concerns a quantum processing device 1, 2, 3. The main features of this device have already been described in reference to the present methods and are therefore only briefly reminded here.

A. minima, this device 1, 2, 3 includes n fixed-frequency QCs 11-14, 1j, each having a distinct frequency, in addition to a tunable coupler 20, to which the QCs are coupled. At least 3 QCs are involved (n≥3). The coupler 20 is designed so that its frequency can be concomitantly modulated S20 at m frequencies, m≥2. Again, the quantum circuits are meant to be used as computational qubits, contrary to the coupling element 20. In addition, the device includes at least one controller 30, which is configured in the processing device 1, 2, 3 to modulate the frequency of the TC 20 concomitantly at said m frequencies, wherein each of the frequencies corresponds to a difference of energy between a respective pair of system states, as explained earlier. This makes it possible, in turn, to drive S30 m energy transitions between connected pairs of states spanned by the QCs and achieve an entangled state, as already discussed in reference to the present methods.

The controller 30 typically includes a control line 30 (i.e., a physical wire), to apply the signals. The controller allows multi-frequency signals to be applied and, if necessary, to suitably set amplitudes and phases of the applied signals.

As illustrated in FIGS. 7-10, embodiments of the present processing devices may involve more than three, e.g., four, six or more fixed-frequency QCs 1j, each coupled to a TC 20. Preferably, the present QCs 11-14, 1j are embodied as superconducting QCs, forming the basis computational elements. In particular, the present circuits can be fixed-frequency, transmon-type QCs, realized as single-Josephson junction superconducting qubits. This way, the processing devices 1, 2, 3 take advantage of long coherence times of the fixed-frequency transmons. Note that the coupler 20 too may be realized by a transmon, although the latter will not form part of the basis computational elements 11-40, 1j.

Figure 8:
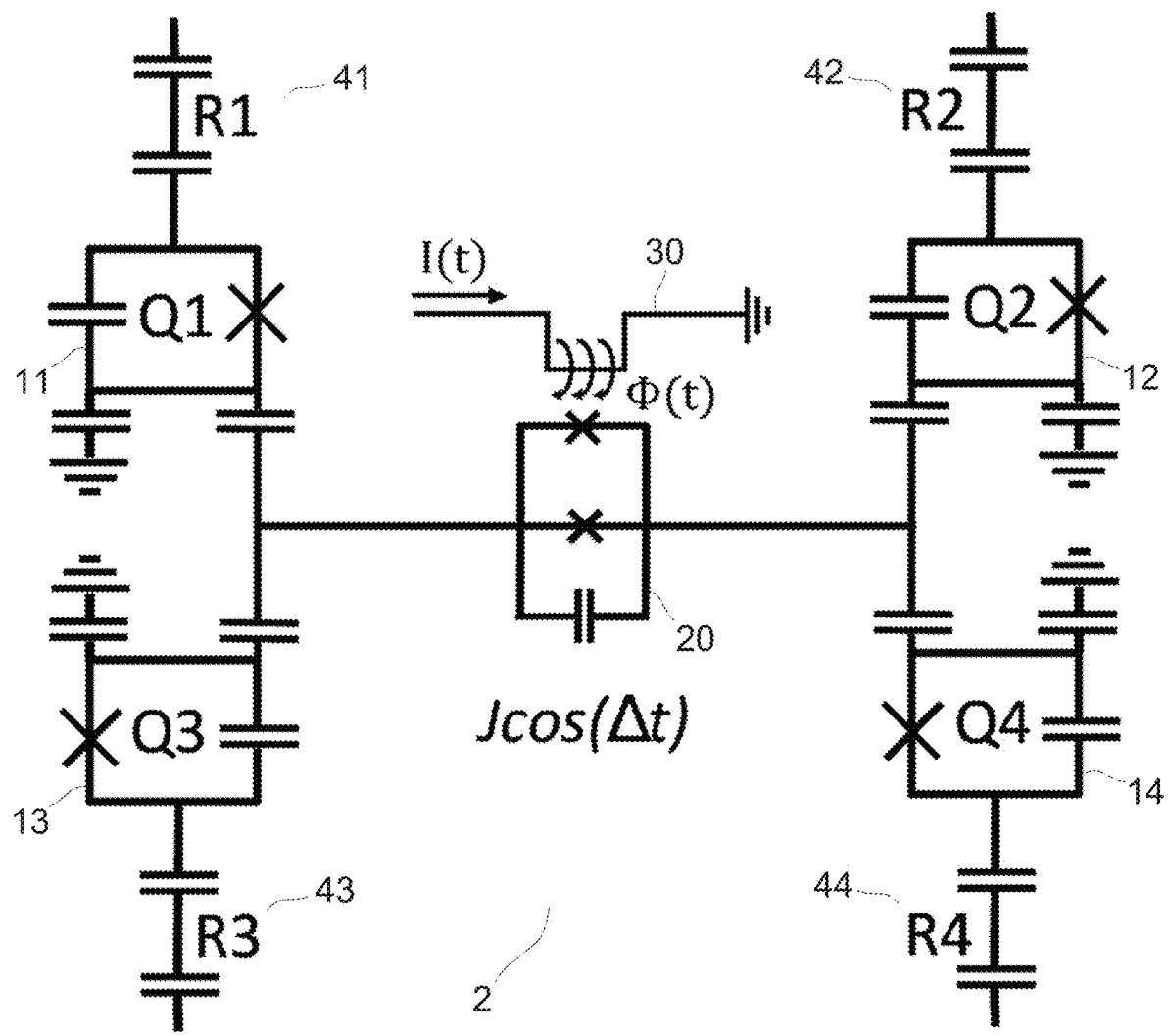
FIG. 8 is a circuit diagram of another example of a multi-qubit coupling architecture, involving four transmon-type qubits coupled via a frequency-tunable coupling element, according to embodiments.
Figure 9:
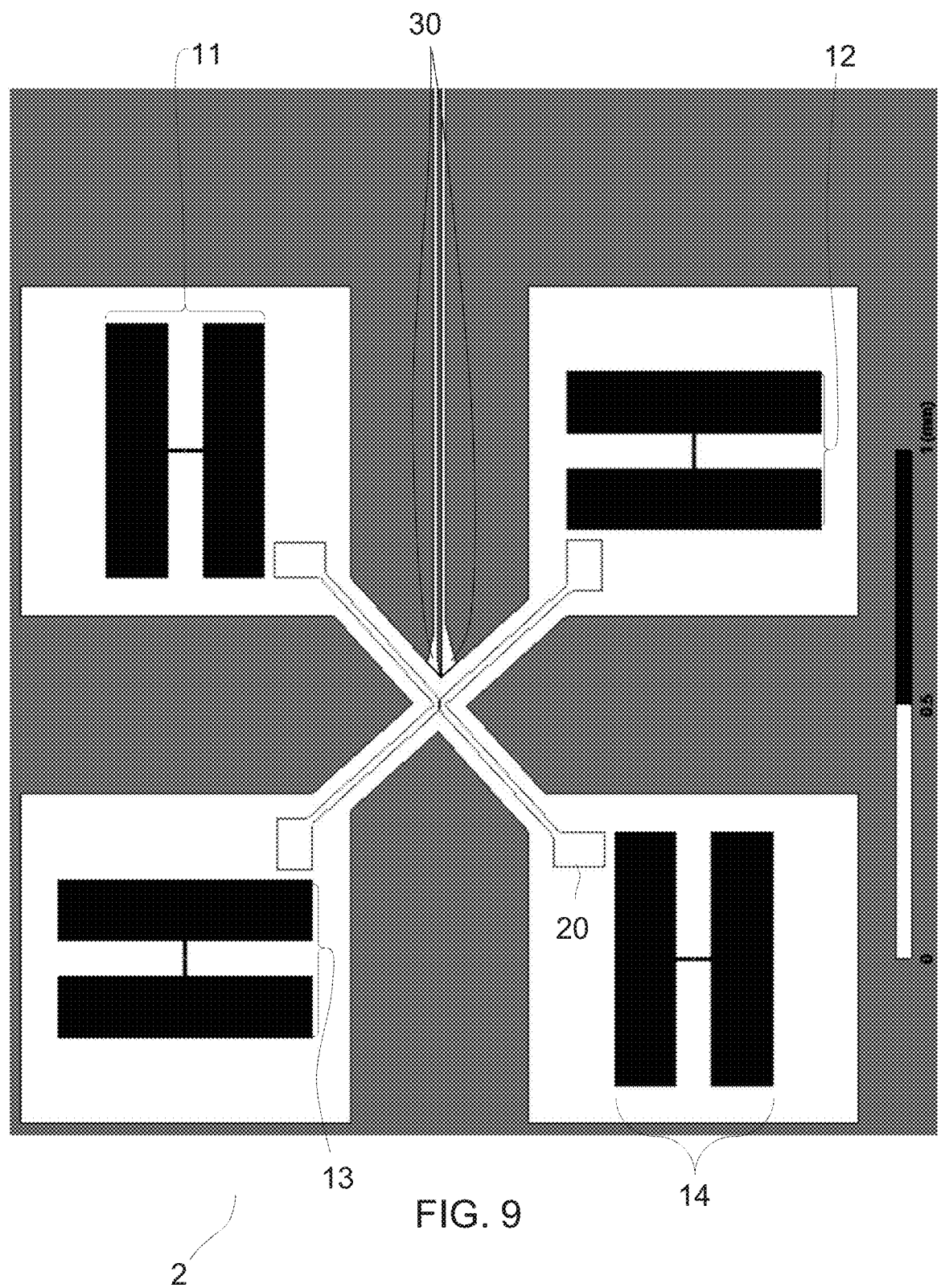
FIG. 9 shows an example geometry for the multi-qubit coupling architecture of FIG. 8, according to embodiments. Physical features depicted in FIG. 9 are not necessarily to scale.

In all cases, the TC 20 may be capacitively coupled to each of the QCs 11-14, 1j. For example, and as illustrated in FIGS. 8 and 9, a processing device 2 may involve four fixed-frequency, single-Josephson junction superconducting qubits 11-14 with long coherence times (e.g., transmon-type devices) as the basis computational elements and a TC 20. In this example, the TC 20 is laid out as a non-harmonic oscillator circuit, such as a qubit of the transmon type. Yet, the coupler 20 is given an extra degree freedom, by way of an additional Josephson junction (—✕—) which forms a superconducting quantum interference device (SQUID) loop. In the example of FIG. 8 or 9, the modulation of the TC frequency is realized by altering the magnetic flux ϕ(t) penetrating the SQUID loop formed by the two Josephson junctions via a current l(t) passed through an inductively coupled flux bias line 30. The modulation of the flux induces a modulation of the effective coupling strength J(t). Each qubit 11-14 is capacitively coupled (⊣ ⊢) to a readout resonator 41-44 (i.e., also denoted by R1-R4 in FIG. 8) and may further possibly be coupled to a charge bias line (not shown) for single qubit gate operations, if needed.

The coupling is performed by modulating the frequency of the TC 20 near or at the frequency corresponding to the desired transitions. The coupler can be regarded as formed by one or more electrodes, as well as the SQUID loop (the latter containing the two Josephson junctions). I.e., the TC 20 may for instance couple to the three (or more) transmons 11-14 via separate electrodes (the latter separated by the SQUID loop) or via a single electrode, with the SQUID loop coupling to the ground. FIG. 9 shows example geometry for four transmon-type qubits 11-14 coupled via a third transmon 20 acting as a frequency-tunable coupling element 20. External magnetic flux applied via the inductively-coupled bias line 30 threads the SQUID loop at the center of the TC 20 and modifies its frequency by modifying the effective Josephson inductance.

Figure 10:
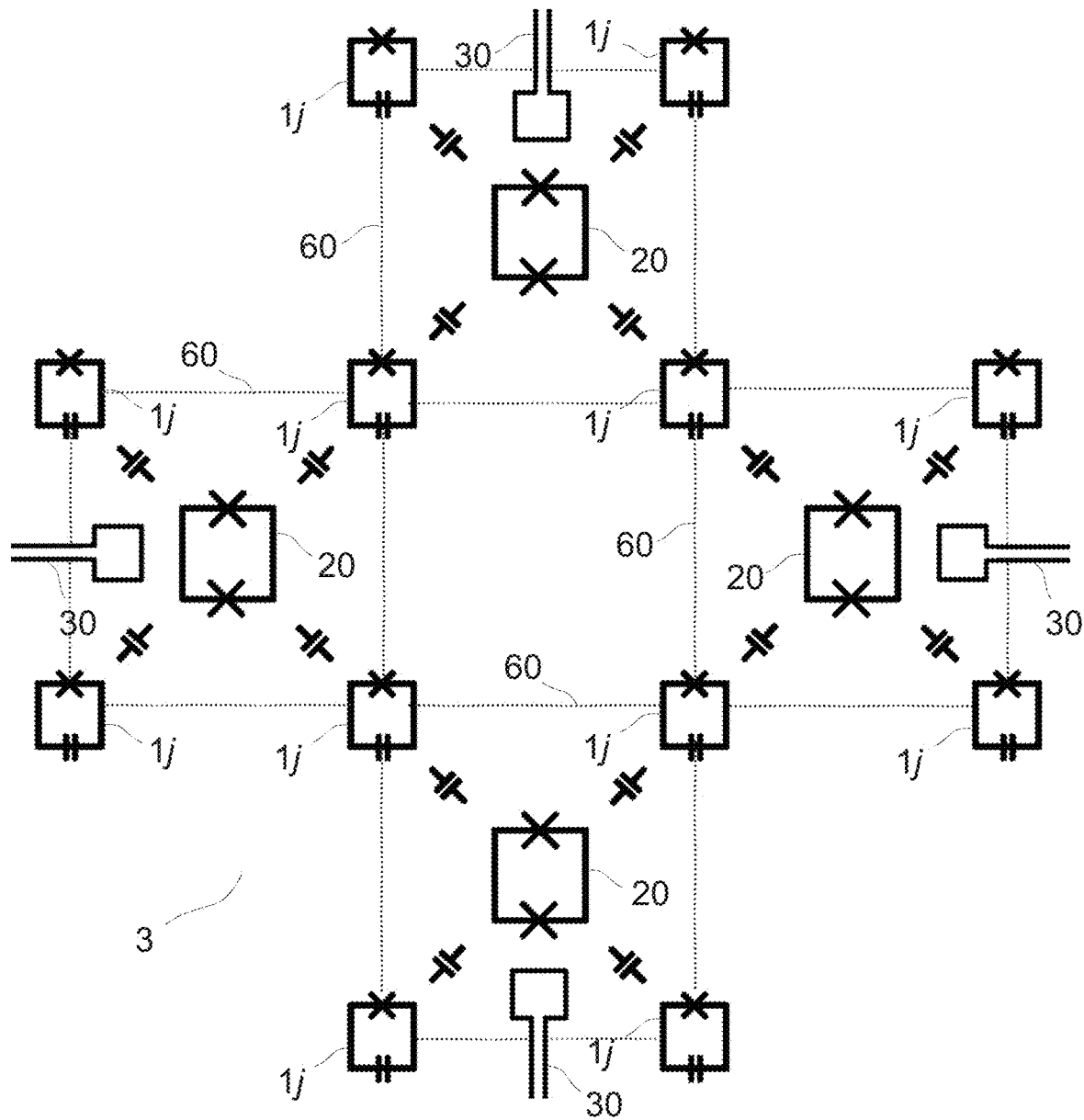
FIG. 10 shows a circuit diagram of a quantum processing chip that includes a plurality of cells, each comprising n fixed-frequency qubits coupled to a frequency-tunable coupler, as well as control lines to apply harmonic microwave signals to selected cells and trigger specific energy transitions, according to further embodiments of the present invention.
Figure 11:
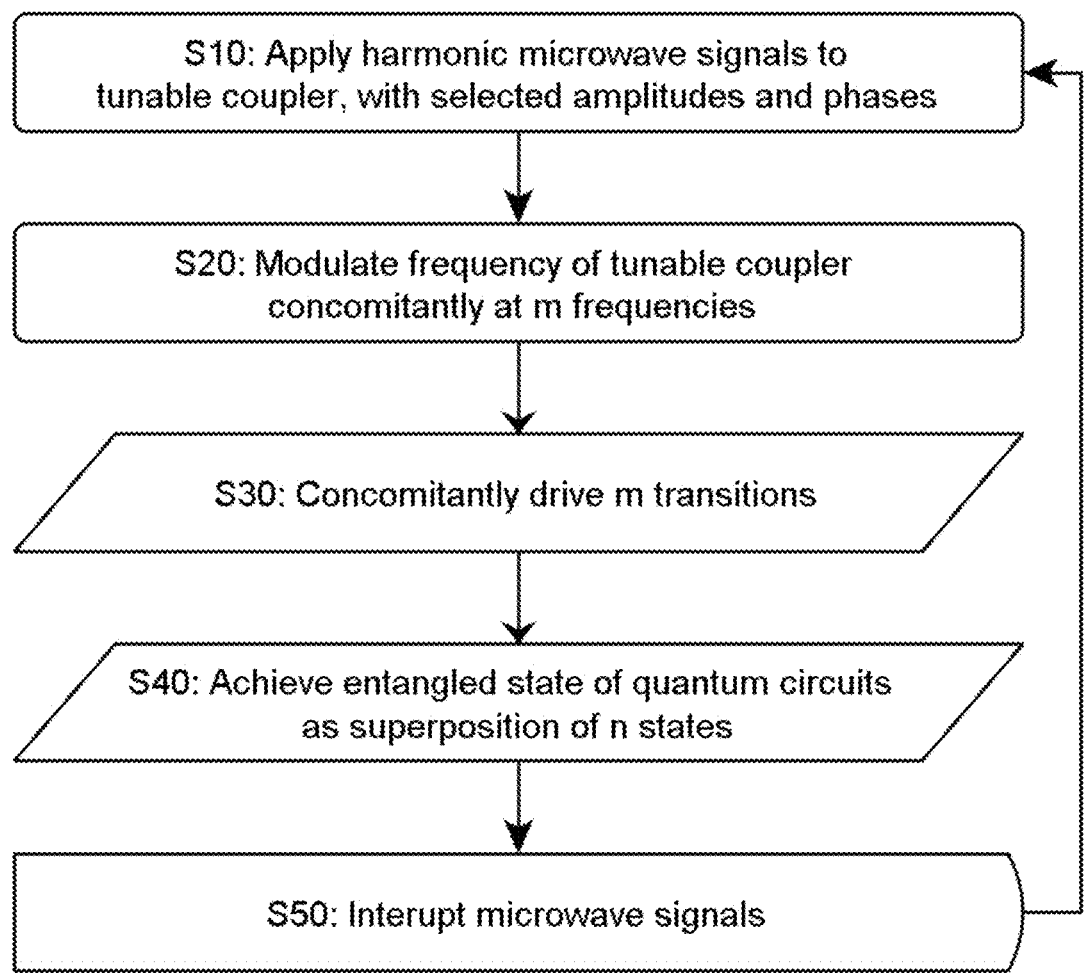
FIG. 11 is a flowchart illustrating high-level steps of a method of operating a quantum processing device according to embodiments.

A final aspect of the invention is now described in reference to FIG. 10, which concerns a quantum processing chip 3. The latter comprises a plurality of cells 60, each comprising two or more fixed-frequency QCs 1j, as well as a TC 20, to which the two or more QCs 1j are coupled. In the example architecture of FIG. 10, the cells form a 2D lattice. Yet, the central square delimited by the four inner qubits does not correspond to a cell in this example, as they are not coupled to a same TC. Each of the four inner qubits bridges one cell to a contiguous cell, such that the cells effectively comprise, each, three qubits on average. Yet, the depicted architecture allows four qubits to be operated per cell. Each cell is otherwise similar to the four qubit arrangement depicted in FIG. 8. In the architecture of FIG. 10, all nearest neighbor qubits can be coupled (except for qubit pairs on the central square). This architecture, however, can be modified to include a coupler at the center to increase the connectivity between the qubits.

A controller system 30 is used to modulate a frequency of signals applied to each TC 20, e.g., via respective control lines 30, so as to drive energy transitions in selected cells. I.e., cells can be independently operated, via a respective control line 30. However, the operation of the cells follows a logic implemented by the controller system, e.g., so as to achieve a desired superposition, which in turn allows more complex operations to be performed by the quantum processing chip 3.

2. Specific Embodiments

This section describes several mechanisms in detail, which allows complex entangled initial states to be created in a short time. In the prior art known to the Inventors the preparation of these states is achieved, e.g., starting from the qubit's system ground state |000 . . . ™, by applying a sequence of single and two-qubit gates, in order to achieve a desired initial state |S™, i.e., a superposition of multi-qubit states. As an example of application: in order to model electronic properties of an atom or molecule, for which 4 orbitals are considered and where 2 orbitals are doubly occupied in the ground state of the system, the initial quantum state |S™ of the system need be brought into a superposition of states, noted |0011™, |0101™, |1001™, |0110™, |1010™ and |1100™, with $$|S^{™}=a_1|0011^{™}+a_2|0101^{™}+a_3|1001^{™}+a_4|0110^{™}+a_5|1010^{™}+a_6|1100^{™},$$

where $a_1 \ldots a_6$ are complex weights (i.e., probability amplitudes) that need be varied by the algorithm, e.g., to achieve an energy minimum. In an architecture with only single- and two-qubit gates, the preparation of such a state |S™, starting from the ground state |0000™, requires a relatively large number of gate operations, which need be applied sequentially and therefore consume a significant amount of time. More generally, one understands that, in a non-error corrected hardware, the time needed for state preparation may severely limits the fidelity of the initial state.

The present section describes in detail solutions to create a selectable multi-qubit entangled state in short time, using a hardware-efficient method. To that aim, use is made of an architecture where multiple qubits (n>2) are connected to a single tunable coupler (TC), which allows m transitions between states of the coupled qubits to be parametrically driven, m≥2. This is achieved by modulating the TC energy at frequencies matching the differences in energy between the desired states of the system, by modulating a flux line close to the TC. I.e., the coupler is concomitantly modulated at m frequencies, so as to achieve the m transitions between connected pairs of states of the system and bring the latter into a superposition of l≥m states, as explained in the previous section. Of interest is that the proposed mechanism allows transitions between connected pairs of states to be achieved, whereby corresponding states can be efficiently entangled. The solutions discussed herein eventually allow more flexibility and larger combinations of superpositions of states to be achieved in short time.

FIGS. 1-6 all assume a system comprising n=3 qubits, where each qubit behaves as a two-level system. More generally though, the TC can be connected to n different qubits, where each of these qubits requires to be at a different frequency $f_{Qi}$. For instance, the designs shown in FIGS. 7-10 show architectures wherein more than three qubits are coupled to one or more TCs. FIG. 10 depicts a processing chip involving several cells with respective qubits and couplers.

FIG. 1 shows a TC 20 connected to three qubits, Q1, Q2, Q3. The values of $f_{Qi}$ indicated on the right-hand side of each qubit Qi and the coupler TC denote possible, fixed frequencies thereof. The values of $g_{Qi,TC}$ in italic denote the direct coupling strengths between the TC and each qubit. All numbers are in GHz; such numbers were for instance used in simulations to demonstrate the operation principle of concepts underlying the present invention. FIG. 2 is a level diagram of the three-qubit states involved, showing three transitions driving the |000™ state to the |011™, |101™ and |110™ states.

With these parameters, the TC 20 can be driven at a frequency corresponding to |101™-|000™=8.4939 GHz to bring the $|000\rangle$ state into a $|101\rangle$ state (and vice versa). Similarly, a drive frequency at 9.0615 GHz=$|011\rangle$–$|000\rangle$ allows a transition between the $|000\rangle$ state and the $|011\rangle$ state, and a drive at 9.3678 GHz=$|110\rangle$–$|000\rangle$ couples the $|000\rangle$ state to the $|110\rangle$ state.

Simulations performed by the Inventors have shown that transitions between two selectable states can be achieved, where the selection is made by the choice of the frequency. The present solutions make use of the possibility to modulate the TC at more than one frequency simultaneously. I.e., the TC energy, noted $E_{TC}$, is modulated at m different frequencies $f_i$ with amplitudes $c_i$ according to $$E_{TC}=E_{TC,0}(1+\Sigma_{i=1}^{m} c_i \exp(i2\pi f_i t)) \quad (1)$$

By suitably choosing $f_i$ and $c_i$, different transitions between the states spanned by the n qubits can be driven simultaneously, so as to create entangled states within short times. In practice, the way the flux line modulates $E_{TC}$ is slightly more complex than what Eq. (1) may suggest, due to the nonlinear dependence of $E_{TC}$ on the flux. This, however, does not affect the description that follows.

2.1 Sum Transitions

The present approach is first exemplified in FIG. 3 for n=3 qubits, by applying m=3 different frequencies, starting from the $|000\rangle$ state. FIG. 3 shows the evolution of the populations of the states $|000\rangle$, $|110\rangle$, $|101\rangle$ and $|011\rangle$ while the TC is driven at the three frequencies, namely $f_1$=8.4942 GHz, $f_2$=9.0618 GHz and $f_3$=9.3682 GHz, simultaneously applied with same amplitudes $c_i$=0.2, adopting the notations of Eq. (1). Such frequencies respectively correspond to energy differences between the states $|101\rangle$ and $|000\rangle$, $|011\rangle$ and $|000\rangle$, and $|110\rangle$ and $|000\rangle$. FIG. 3 shows that the overall state, which initially corresponds to $|000\rangle$, evolves into a superposition of the states $|000\rangle$, $|101\rangle$, $|011\rangle$ and $|110\rangle$. In the example of FIG. 3, zero probability remains in the state $|000\rangle$ after 270 ns and all population is transferred to the $|101\rangle$, $|011\rangle$ and $|110\rangle$ states. The created state is therefore a superposition $a_1|101\rangle + a_2|011\rangle + a_3|110\rangle$, with complex amplitudes $a_i$.

Interestingly, and as evoked earlier in sect. 1, the weights $a_i$ can be controlled by the complex amplitudes $c_i$ of the TC modulation frequencies. The individual, direct coupling strengths $g_{Qi,TC}$ (see FIG. 1) also influence the outcome of the amplitudes $a_i$ in a deterministic way. Such coupling strengths are determined by the design of the circuits and can be regarded as being constant, in operation of the device. Thus, the amplitudes $a_i$ depend on the direct couplings strengths $g_{Qi,TC}$ as well as the amplitudes $c_i$, phases and duration of the TC modulation signals. Yet, the amplitudes $a_i$ are essentially controlled by the amplitudes $c_i$, phases and durations chosen for the TC modulation signals.

More generally, n qubits in a state $|\ldots 0 \ldots 0\rangle$ can be driven into a superposition of m states $|\ldots 1 \ldots 1\rangle$ by simultaneous application of m different frequencies to a TC, where each of the latter states has two qubits in the excited $|1\rangle$ states, while all others qubits remain in the $|0\rangle$ states. This can be achieved via a controllable probability density of the states by appropriately choosing the frequencies, amplitudes and phases of the signals applied, as discussed earlier. The m different frequencies preferably match (as exactly as possible) the energy difference between the states involved, i.e., $|\ldots 1 \ldots 1\rangle$ and $|\ldots 0 \ldots 0\rangle$, which happens to be close to the sum of two intermediate transitions (i.e., from $|\ldots 0 \ldots 0\rangle$ to $|\ldots 1 \ldots 0\rangle$ and $|\ldots 0 \ldots 0\rangle$ to $|\ldots 0 \ldots 1\rangle$), whence the terminology of "sum transitions". Such transitions are characterized by parallel (de-) excitations of individual states of the qubits.

Using the above approach, the creation of the superposition state is achieved within a time that corresponds to a single 2-qubit operation (which was estimated to amount to approximately 270 ns in the example of FIG. 3).

2.2 Difference Transitions

In the previous example, individual TC frequencies $f_i$ were chosen at energy differences of states $A_i$ and $B_i$ that differ in two individual qubit states, which are, say, $|1\rangle$ for $A_i$ and $|0\rangle$ for $B_i$. In a similar way, simultaneous transitions between states $A_i$ and $B_i$ can be driven, which now involve anti-parallel transitions between individual qubit states. Again, individual TC frequencies $f_i$ can be chosen to match energy differences between states $A_i$ and $B_i$ that differ in two individual qubit states, which are now, e.g., $|1\rangle$ and $|0\rangle$ for $A_i$ and $|0\rangle$ and $|1\rangle$ for $B_i$, i.e. $A_i = |\ldots 1 \ldots 0 \ldots\rangle$ and $B_i = |\ldots 0 \ldots 1 \ldots\rangle$. Such transitions are referred to as difference transitions. Also in this scheme, the population in the states $B_i$ can be simultaneously transferred to the states $A_i$ and vice versa. An example is given in FIG. 4, again assuming n=3 qubits. Here, the initial population in the $|001\rangle$ state is transferred simultaneously into the $|100\rangle$ and $|010\rangle$ states. Only two frequencies are needed here to drive the $|001\rangle$–$|100\rangle$ and the $|001\rangle$–$|010\rangle$ transitions, whereby a state can controllably be achieved as a superposition of the states $|001\rangle$, $|010\rangle$ and $|100\rangle$.

FIG. 5 illustrates another example where, in addition to the two frequencies of the previous example, a third TC frequency that drives the $|100\rangle$–$|010\rangle$ transition is included. This added frequency provides additional flexibility to obtain more complex superpositions.

2.3 Sum and Difference Transitions

Interestingly, the present approach is not restricted to either $|\ldots 0 \ldots 0 \ldots\rangle$–$|\ldots 1 \ldots 1 \ldots\rangle$ (sum) or to $|\ldots 1 \ldots 0 \ldots\rangle$–$|\ldots 0 \ldots 1 \ldots\rangle$ (difference) transitions. As it may be realized, both kinds of transitions can actually be driven simultaneously, facilitating the generation of even more complex superposition states in short time. As an example, FIG. 6 demonstrates the evolution from an initial $|000\rangle + |001\rangle$ state into complex superposition states by applying 6 different transition frequencies simultaneously.

Another mode of operation is to drive transitions between any states $A_i$ and $B_i$ where $A_i$ and $B_i$ differ in two qubits. For example, m=5 transitions between $A_i = |0011\rangle$, $|0101\rangle$, $|1001\rangle$, $|0110\rangle$ and $|1010\rangle$ and $B_i = |1100\rangle$ can be driven simultaneously to prepare arbitrary superposition states of the form $a_1|0011\rangle + a_2|0101\rangle + a_3|1001\rangle + a_4|0110\rangle + a_5|1010\rangle + a_6|1100\rangle$.

As disclosed, for example, a method of operating a quantum processing device may be provided. Related quantum processing devices and processing chips may be provided.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method of operating a quantum processing device comprising a frequency-tunable coupler and n fixed-frequency quantum circuits of distinct frequencies, n≥3, each of the quantum circuits coupled to the tunable coupler, wherein a frequency of the tunable coupler can be concomitantly modulated at m frequencies, wherein m≥2, and wherein said m frequencies correspond, each, to a difference of energy between a respective pair of quantum states spanned by the quantum circuits, the method comprising:
   modulating the frequency of the tunable coupler concomitantly at said m frequencies, so as to drive m energy transitions between connected pairs of states spanned by the quantum circuits and achieve an entangled state of the quantum circuits as a superposition of l states spanned by the quantum circuits, where l≥m.

2. The method according to claim 1, wherein
   the number m of frequencies used to concomitantly modulate the tunable coupler is less than or equal to $C(C(n, k), 2)$, for a given value of k, where n−1≥k≥1 and $C(n, k)$ denotes a binomial coefficient $\binom{n}{k}$.

3. The method according to claim 2, wherein
   the number m of frequencies used to concomitantly modulate the tunable coupler is less than or equal to $C(n, k)$, for a given value of k, where n−1≥k≥1.

4. The method according to claim 3, wherein
   the frequency of the tunable coupler is concomitantly modulated at $m=C(n, k)$ frequencies, for said given value of k.

5. The method according to claim 4, wherein
   the frequency of the tunable coupler is concomitantly modulated at said m frequencies during a period of time such as to achieve an entangled state as a superposition of $l=m=C(n, k)$ states spanned by the quantum circuits.

6. The method according to claim 3, wherein:
   the states of said connected pairs of states are, each, representable as tensor products of individual states |a™ of the quantum circuits, and
   said m frequencies are such that each of the driven energy transitions involves exactly two parallel transitions between individual states |a™ of the quantum circuits.

7. The method according to claim 2, wherein
   the states of said connected pairs of states are, each, representable as tensor products of individual states |a™ of the quantum circuits, and
   said m frequencies are such that each of the driven energy transitions involves anti-parallel transitions between individual states |a™ of the quantum circuits.

8. The method according to claim 7, wherein:
   the number m of frequencies used to concomitantly modulate the tunable coupler is equal to $C(C(n, k), 2)$, for said given value of k.

9. The method according to claim 1, wherein
   the states of said connected pairs of states are, each, representable as tensor products of individual states |a™ of the quantum circuits, and
   said m frequencies are such that some of the driven energy transitions involve parallel transitions between individual states |a™ of the quantum circuits, whereas other ones of the driven energy transitions involve anti-parallel transitions between such individual states |a™.

10. The method according to claim 1, wherein
    the m energy transitions are driven by applying harmonic microwave signals to the tunable coupler, the signals modulated so as to modulate the frequency of the tunable coupler at said m frequencies.

11. The method according to claim 10, further comprising setting amplitudes, phases and durations of the signals applied to the tunable coupler, so as to control amplitudes and phases of coefficients $a_i$ weighting the l states spanned by the quantum circuits in the entangled state achieved.

12. A quantum processing device, comprising:
    n fixed-frequency quantum circuits of distinct frequencies, n≥3;
    a frequency-tunable coupler, to which the n quantum circuits are coupled, the coupler configured so that a frequency of the coupler can be concomitantly modulated at m frequencies, m≥2, wherein said m frequencies correspond, each, to a difference of energy between a respective pair of quantum states spanned by the quantum circuits; and
    a controller, configured in the quantum processing device to modulate the frequency of the tunable coupler concomitantly at said m frequencies, so as to drive m energy transitions between connected pairs of states spanned by the quantum circuits and achieve an entangled state of the quantum circuits as a superposition of l states spanned by the quantum circuits, where l≥m.

13. The quantum processing device according to claim 12, wherein
    each of said quantum circuits is a superconducting quantum circuit.

14. The quantum processing device according to claim 12, wherein
    each of said quantum circuits is a fixed-frequency, transmon-type quantum circuit.

15. The quantum processing device according to claim 12, wherein
    the tunable coupler is capacitively coupled to each of the quantum circuits.

16. The quantum processing device according to claim 12, wherein
    the controller is further configured to apply harmonic microwave signals to the tunable coupler and modulate the signals applied so as to modulate the frequency of the tunable coupler at said m frequencies.

17. The quantum processing device according to claim 13, wherein
    the controller is further configured to allow setting amplitudes, phases and durations of the signals applied to the tunable coupler, so as to control amplitudes and phases of coefficients $a_i$ weighting the l states spanned by the quantum circuits in the entangled state to be achieved.

18. A quantum processing chip, comprising
    a plurality of cells, each comprising:
    n fixed-frequency quantum circuits of distinct frequencies, n≥3; and
    a frequency-tunable coupler, to which the n quantum circuits are coupled, the coupler configured so that a frequency of the coupler can be concomitantly modulated at m frequencies, m≥2, wherein said m frequencies correspond, each, to a difference of energy between a respective pair of quantum states spanned by the quantum circuits, and a controller system, the latter configured in the quantum processing chip to concomitantly modulate a frequency of signals applied to the tunable coupler of each of the cells, at m frequencies, so as to drive m energy transitions between connected pairs of states spanned by the quantum circuits in selected ones of the cells, whereby, for each of said selected ones of the cells, an entangled state of the quantum circuits can be achieved as a superposition of l states spanned by the quantum circuits, where $l \geq m$, in operation of the chip.

* * * * *